(12) United States Patent
Hoentschel et al.

(10) Patent No.: US 9,343,374 B1
(45) Date of Patent: May 17, 2016

(54) EFFICIENT MAIN SPACER PULL BACK PROCESS FOR ADVANCED VLSI CMOS TECHNOLOGIES

(71) Applicant: GLOBALFOUNDRIES Inc., Grand Cayman (KY)

(72) Inventors: Jan Hoentschel, Dresden (DE); Peter Javorka, Radeburg (DE); Stefan Flachowsky, Dresden (DE); Ralf Richter, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/527,207

(22) Filed: Oct. 29, 2014

(51) Int. Cl.
| | |
|---|---|
| H01L 21/336 | (2006.01) |
| H01L 21/3205 | (2006.01) |
| H01L 21/4763 | (2006.01) |
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 21/8238 | (2006.01) |
| H01L 29/66 | (2006.01) |
| H01L 27/092 | (2006.01) |
| H01L 29/78 | (2006.01) |
| H01L 29/49 | (2006.01) |

(52) U.S. Cl.
CPC H01L 21/823864 (2013.01); H01L 21/823814 (2013.01); H01L 27/092 (2013.01); H01L 29/4916 (2013.01); H01L 29/665 (2013.01); H01L 29/6653 (2013.01); H01L 29/6659 (2013.01); H01L 29/66492 (2013.01); H01L 29/66583 (2013.01); H01L 29/66636 (2013.01); H01L 29/66689 (2013.01); H01L 29/7816 (2013.01); H01L 29/7833 (2013.01)

(58) Field of Classification Search
CPC ............... H01L 21/823864; H01L 21/823814; H01L 29/66492; H01L 29/665
USPC ........................... 438/305, 592; 257/368, 369
See application file for complete search history.

(56) References Cited

U.S. PATENT DOCUMENTS

| | | | | |
|---|---|---|---|---|
| 8,361,844 | B2 * | 1/2013 | Frohberg | H01L 21/28123 438/142 |
| 2011/0284966 | A1 * | 11/2011 | Wen | H01L 21/823456 257/368 |
| 2013/0270647 | A1 * | 10/2013 | Zhu | H01L 21/022 257/369 |
| 2013/0320449 | A1 * | 12/2013 | Hoentschel | H01L 21/823807 257/368 |
| 2013/0320450 | A1 * | 12/2013 | Hoentschel | H01L 27/092 257/368 |
| 2015/0132902 | A1 * | 5/2015 | Chuang | H01L 29/66545 438/210 |

* cited by examiner

*Primary Examiner* — David S Blum
(74) *Attorney, Agent, or Firm* — Ditthavong & Steiner, P.C.

(57) ABSTRACT

Forming a poly-Si device including pulling back spacers prior to silicidation and the resulting device are provided. Embodiments include forming two poly-Si gate stacks on an upper surface of a substrate; forming a hardmask over the second poly-Si gate stack; forming eSiGe with a silicon cap at opposite sides of the first poly-Si gate stack; removing the hardmask; forming nitride spacers at opposite sides of each of the poly-Si gate stacks; forming deep source/drain regions at opposite sides of the second poly-Si gate stack; forming a wet gap fill layer around each of the poly-Si gate stacks to a thickness less than the poly-Si gate stack height from the substrate's upper surface; removing an upper portion of the nitride spacers down to the height of the wet gap fill layer followed by removing the wet gap fill layer; and performing silicidation of the deep source/drain regions and the silicon cap.

20 Claims, 12 Drawing Sheets

EFFICIENT MAIN SPACER PULL BACK PROCESS FOR ADVANCED VLSI CMOS TECHNOLOGIES

TECHNICAL FIELD

The present disclosure relates to fabrications of semiconductor devices with multiple spacer formations. The present disclosure is particularly applicable to low power and high performance devices for 32 nanometer (nm) technologies.

BACKGROUND

Continued scaling towards 20 nm and 14 nm VLSI CMOS technologies increases marginalities, variability, and changes in manufacturability. Scaling in polysilicon (poly-Si) pitches between devices results in a minimum space where serval implants, stress memorization techniques, salicidation, dual stress liners, and strained contacts have to find space.

Modern integrated circuits use several poly pitches depending on the gate lengths of the devices used. Multiple spacer formations for one device in a technology results in less space for implantation, salicidation, and contact formation, as poly-Si pitch decreases. The spacers need to be removed to make space for a contact isolation layer as well as the contact itself to prevent voids and, therefore, contact shorts from forming. The spacer removal is currently performed after silicide formation with a dry etch that attacks the silicide surface, which increases serial resistance and degrades device performance.

A need therefore exists for methodology enabling fabrication of a low power, high performance semiconductor device with a spacer pullback process that does not attack the source/drain silicide surface and the resulting device.

SUMMARY

An aspect of the present disclosure is a method of forming a poly-Si CMOS device including pulling back spacers process prior to silicidation.

Another aspect of the present disclosure is a poly-Si CMOS device with pulled back spacers.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming first and second polysilicon (poly-Si) gate stacks on an upper surface of a substrate; forming a hardmask over the second poly-Si gate stack; forming embedded silicon germanium (eSiGe) at opposite sides of the first poly-Si gate stack; forming a silicon cap over the eSiGe; removing the hardmask; forming nitride spacers at opposite sides of each of the first and second poly-Si gate stacks; forming deep source/drain regions at opposite sides of the second poly-Si gate stack; forming a wet gap fill layer around each of the first and second poly-Si gate stacks to a thickness less than a height of the poly-Si gate stack from the substrate's upper surface; removing an upper portion of the nitride spacers down to the height of the wet gap fill layer; removing the wet gap fill layer after removing the upper portion of the nitride spacers; and performing silicidation of the deep source/drain regions and the silicon cap over the eSiGe after removing the wet gap fill layer.

Aspects of the present disclosure include forming the hardmask over the second poly-Si gate stack by: forming a hardmask over the first and second poly-Si gate stacks and over the substrate; forming a resist over the second poly-Si gate stack and a portion of the substrate adjacent each side of the second poly-Si gate stack; anisotropically etching the hardmask over the first poly-Si gate stack and a portion of the substrate adjacent each side of the first poly-Si gate stack, leaving spacers at opposite sides of the first poly-Si gate stack; and removing the resist. Other aspects include forming the eSiGe at opposite sides of the first poly-Si gate stack in the portion of the substrate adjacent each side of the first poly-Si gate stack. Further aspects include forming the eSiGe at opposite sides of the first poly-Si gate stack by: forming a cavity by wet etching with tetramethylammonium hydroxide (TMAH); and epitaxially growing SiGe in the cavity. Additional aspects include implanting a boron dopant in-situ into the eSiGe. Another aspect includes implanting the boron dopant with a graded doping profile. Further aspects include forming a lightly doped drain region and a halo region at opposite sides of the first poly-Si gate stack after forming the hardmask.

Still other aspects include forming the nitride spacers at opposite sides of each of the first and second poly-Si gate stacks by forming two spacers at each side of each of the first and second poly-Si gate stacks. Further aspects include forming halo regions and extension regions at opposite sides of the second poly-Si gate stack after forming the nitride spacers. Another aspect includes performing a rapid temperature anneal after forming the deep source/drain regions, the halo regions, and the extension regions. Additional aspects include forming the wet gap fill layer by: spinning a wet gap fill material over the first and second poly-Si gate stacks and over the substrate; and removing the wet gap fill material down to a thickness of 400 to 600 Å from a top surface of the substrate. A further aspect includes removing the wet gap fill material by baking or ashing at 60 to 90° C. for 50 to 150 seconds. Another aspect includes removing the upper portion of the nitride spacers by dry etching. An additional aspect includes removing the wet gap fill layer by a plasma strip and clean process.

Another aspect of the present disclosure includes a device including: first and second polysilicon (poly-Si) gate stacks on an upper surface of a substrate; nitride spacers at opposite sides of each of the first and second poly-Si gate stacks, the nitride spacers having a height less than a height of the poly-Si gate stacks from the substrate's upper surface; embedded silicon germanium (eSiGe) at opposite sides of the first poly-Si gate stack; a silicon cap over the eSiGe; deep source/drain regions at opposite sides of the second poly-Si gate stack; extension and halo regions at opposite sides of the first poly-Si gate stack; and a silicide over the deep source/drain regions and the silicon cap over the eSiGe.

Aspects include the eSiGe being doped in-situ with boron having a graded doping profile. Further aspects include halo and extension regions at opposite sides of the second poly-Si gate stack. Another aspect includes a void-free strained contact isolation material over and between the first and second poly-Si gate stacks. An additional aspect includes the strained contact isolation material including plasma enhanced nitride.

Another aspect of the present disclosure includes a method including: forming first and second polysilicon (poly-Si) gate stacks on an upper surface of a substrate; forming a hardmask over the first and second poly-Si gate stacks and over the substrate; anisotropically etching the hardmask over the first poly-Si gate stack and a portion of the substrate adjacent each side of the first poly-Si gate stack, leaving spacers at opposite sides of the first poly-Si gate stack; forming a cavity at each side of the PMOS poly-Si gate stack by wet etching with TMAH; epitaxially growing SiGe in the cavity; implanting a boron dopant, with a graded doping profile, in-situ into the eSiGe concurrently with the epitaxial growth; forming a silicon cap over the eSiGe; removing the hardmask and the spacers; forming nitride spacers at opposite sides of each of the first and second poly-Si gate stacks; forming deep source/drain regions at opposite sides of the second poly-Si gate stack; spinning a wet gap fill material over the first and second poly-Si gate stacks and over the substrate; baking or ashing the wet gap fill material, reducing a thickness of the wet gap fill material to 400 to 600 Å from a top surface of the substrate; removing an upper portion of the nitride spacers down to the wet gap fill layer; removing the wet gap fill layer after removing the upper portion of the nitride spacers; performing silicidation of the deep source/drain regions and the silicon cap over the eSiGe after removing the wet gap fill layer; and forming a void-free strained contact isolation material over and between the first and second poly-Si gate stacks.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1A:
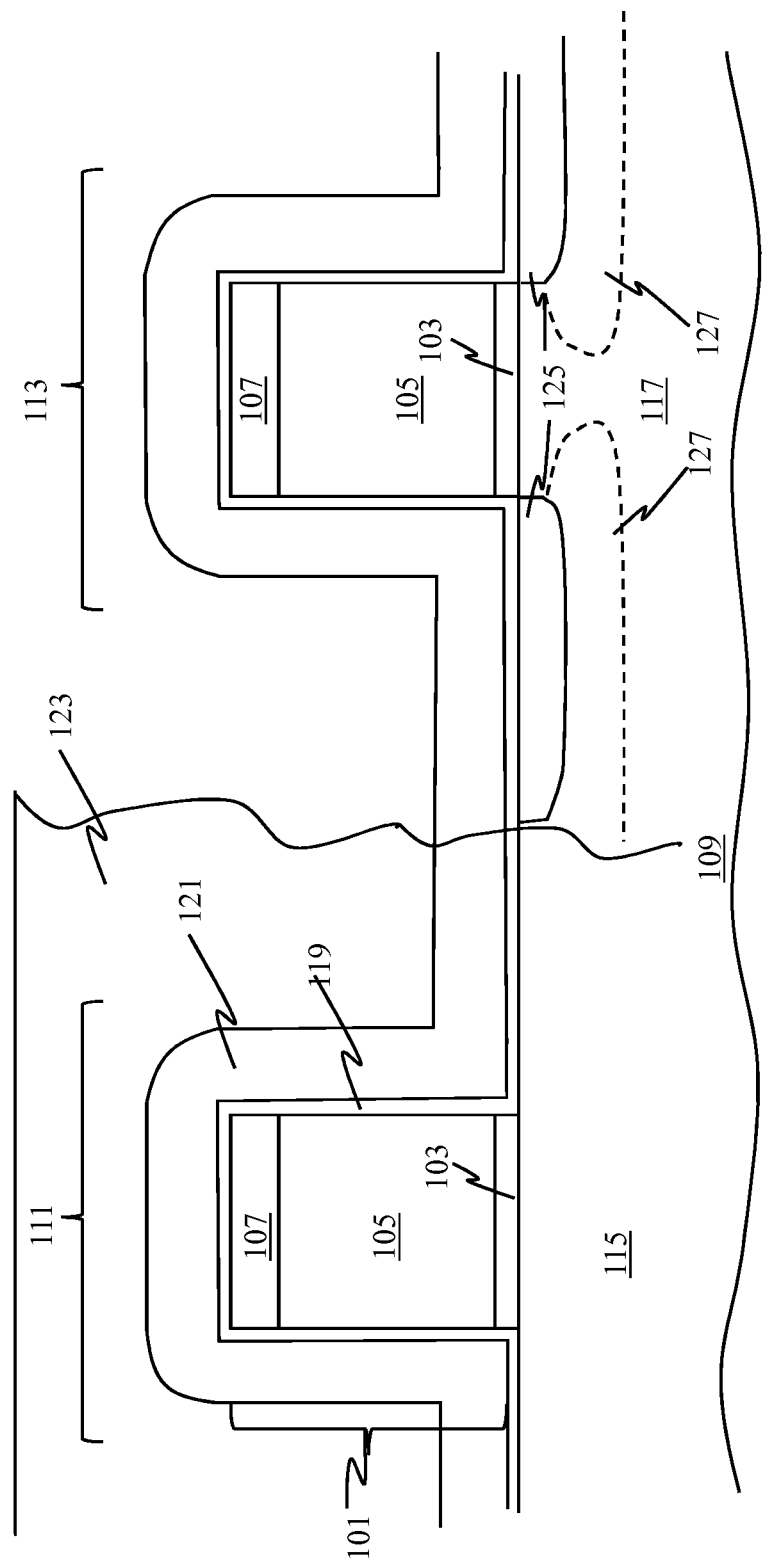
FIGS. 1A through 1K schematically illustrate a process flow for forming a semiconductor device with a spacer pull-back process prior to silicidation, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of a degraded source/drain silicide surface and consequently a decrease in serial resistance, attendant upon performing a spacer shaper etch after silicidation. In accordance with embodiments of the present disclosure, a wet gap fill layer protects source/drain regions during a partial spacer removal prior to silicidation, eliminating the need for a spacer shaper etch subsequent to silicidation.

Methodology in accordance with embodiments of the present disclosure includes forming first and second polysilicon (poly-Si) gate stacks on an upper surface of a substrate. A hardmask is then formed over the second poly-Si gate stack, and eSiGe is formed at opposite sides of the first poly-Si gate stack. After a silicon cap is formed over the eSiGe, the hardmask is removed. Next, nitride spacers are formed at opposite sides of each of the first and second poly-Si gate stacks, and deep source/drain regions are formed at opposite sides of the second poly-Si gate stack. A wet gap fill layer is formed around each of the first and second poly-Si gate stacks to a thickness less than a height of the poly-Si gate stack from the substrate's upper surface, an upper portion of the nitride spacers is removed down to the height of the wet gap fill layer, and then the wet gap fill layer is removed. Finally, silicidation of the deep source/drain regions and the silicon cap over the eSiGe is performed.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1A through 1K illustrate a process flow incorporating a partial spacer etch prior to silicidation, in accordance with an exemplary embodiment of the present disclosure. Adverting to FIG. 1A, a gate stack 101, including silicon dioxide ($SiO_2$) gate dielectric layer 103, poly-Si 105, and silicon nitride (SiN) cap 107, is shown on silicon substrate 109 for each of NMOS 111 and PMOS 113. Substrate 109 is p-doped at 115 (below NMOS 111) and n-doped at 117 (below PMOS 113). After the gate etch, a reoxidized $SiO_2$ layer 119 is conformally formed over the entire substrate to a thickness of 3 nm to 6 nm. A SiN hardmask 121 is formed over reoxidized $SiO_2$ layer 119 to a thickness of 45 nm to 80 nm. Next, a masking step using resist 123 is implemented to open the PMOS and apply p+ lightly doped drain (LDD) implantation 125 and n+ halo implantation 127 for the PMOS. Halo regions are formed, for example, by implanting a low to medium dose (e.g., 3.5E13 to 7E13) of arsenic (As), boron (B), or boron fluoride ($BF_2$) at a medium energy (for example 35 keV to 50 keV). Then, resist 123 may be removed.

Figure 1B:
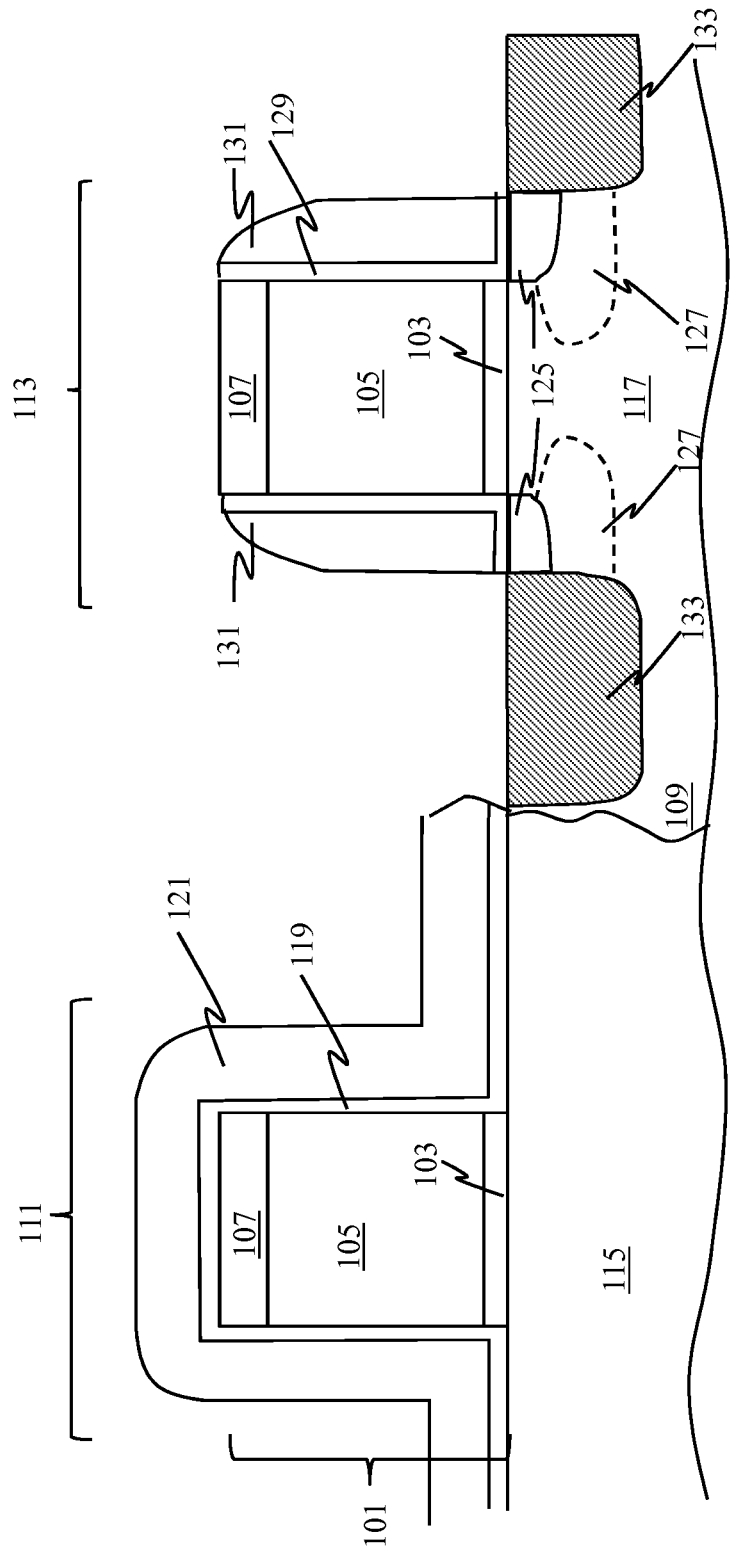

As illustrated in FIG. 1B, reoxidized $SiO_2$ layer 119 and hardmask 121 are anisotropically etched to form $SiO_2$ liner 129 and nitride spacers 131 on each side of PMOS 113, and concurrently, a cavity 133 is etched into the PMOS source/drain regions at opposite sides of PMOS 113. During the formation of liner 129, spacers 131, and cavity 133, hardmask 121 protects NMOS device 111.

Figure 1C:
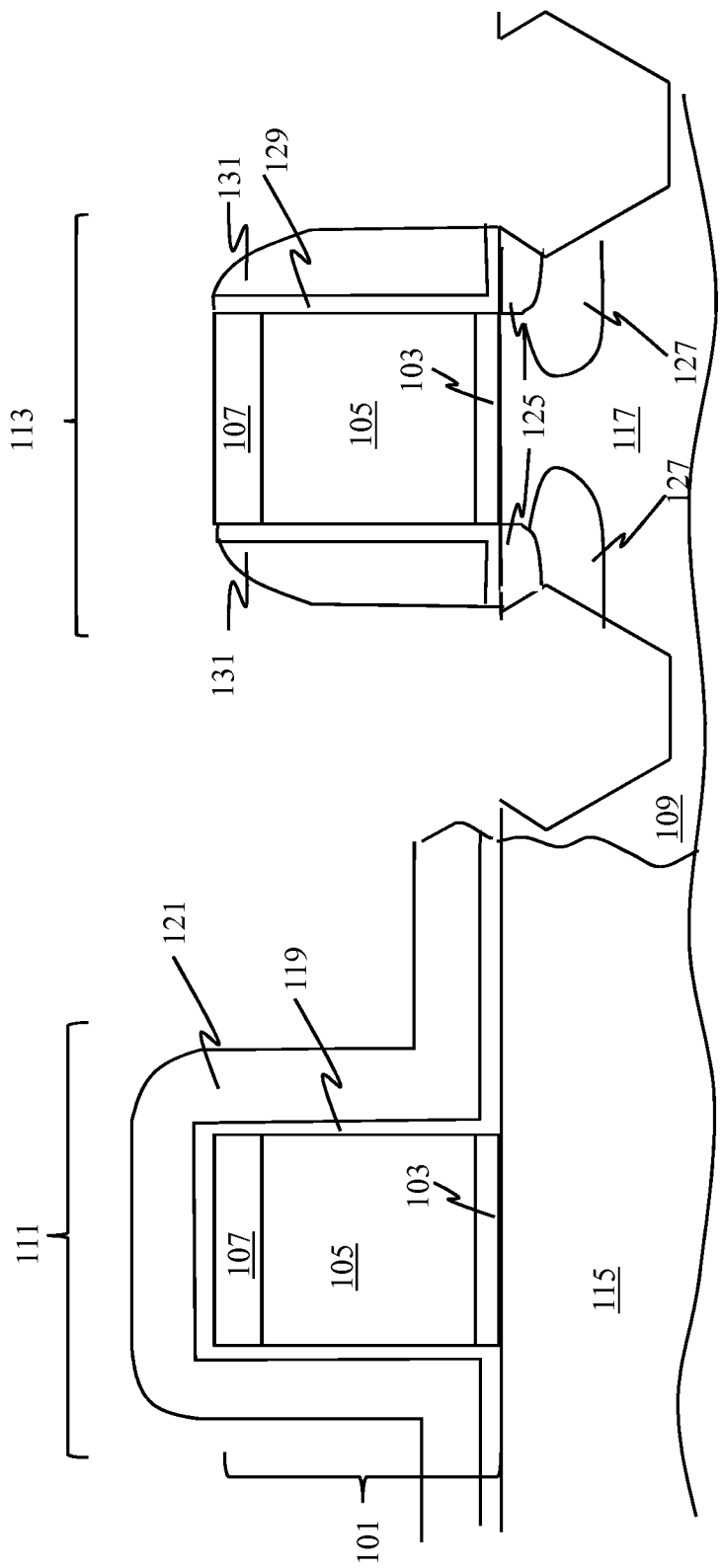

Adverting to FIG. 1C, a sigma shaped cavity 133 is formed in the substrate on each side of the PMOS 113 gate stack using TMAH. Although other shapes are possible, the sigma shaped cavity allows very close proximities and therefore maximum stress inside the transistor channel region. The sigma shape is formed since the chemistry selectively etches along the silicon crystal planes.

Figure 1D:
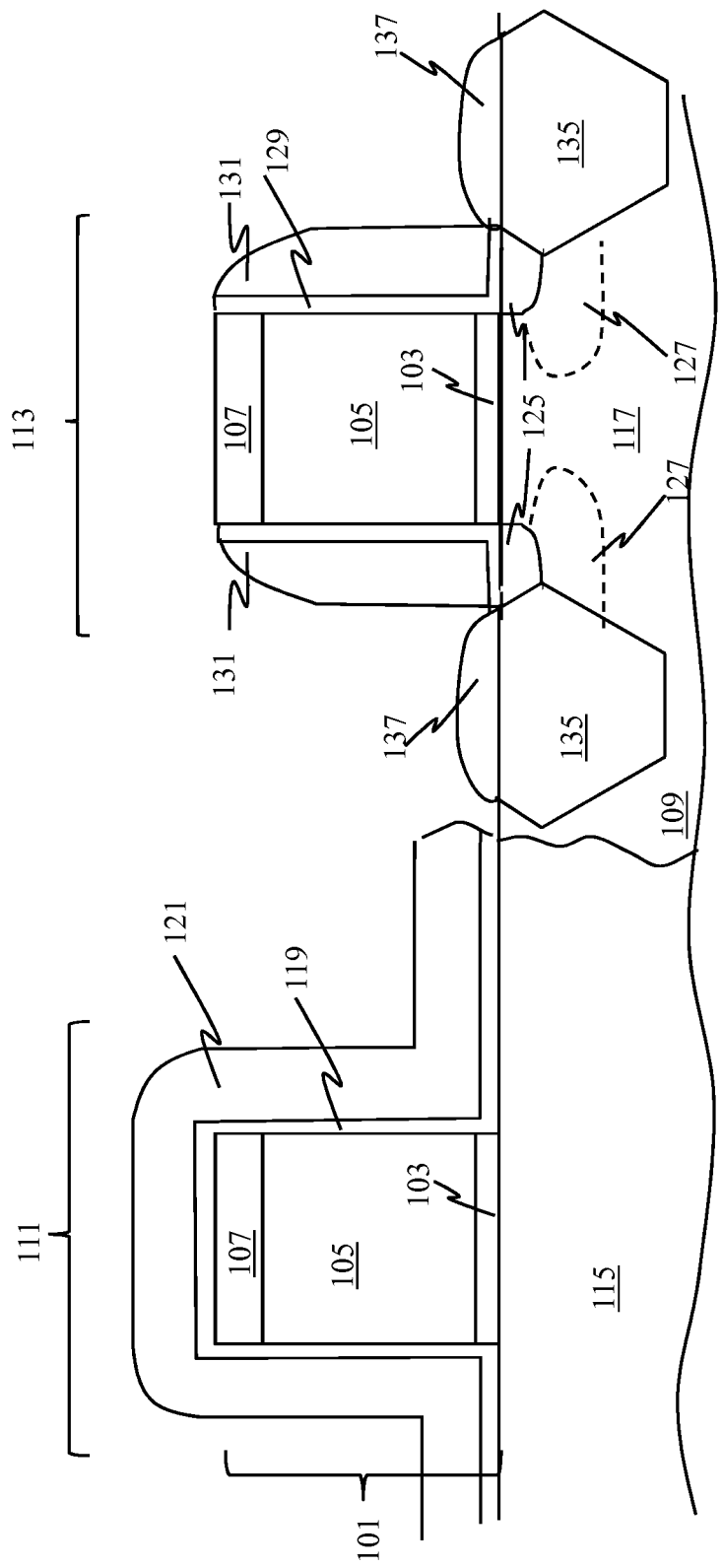

After the cavity formation, as illustrated in FIG. 1D, in-situ boron (B) doped SiGe 135 is grown in the cavities 133, for example by a low-pressure chemical vapor deposition (LPCVD) process for the deep source/drain areas of the PMOS device. The boron allows the germanium content to be increased, e.g. to greater than 35%, as opposed to 25% for undoped SiGe. The doping is graded, such that the Ge % content can vary between 20 and 50%. The Ge % content, along with the depth and proximity to the channel region sets the maximal strain introduction, carrier mobility, and device performance improvement. Also, by doping the source/drain regions of the PMOS during the epitaxy, a dedicated source/drain implantation is eliminated, thereby saving process costs for masks and implantation, reducing cycle time, and reducing stress relaxation from implant damage. Further, the boron dopants are activated by the epitaxy, thereby eliminating the need for an additional anneal. A silicon cap 137 over the SiGe 135 helps to form a more solid encapsulation and margin for subsequent cleans that attack the active open silicon area.

Figure 1E:
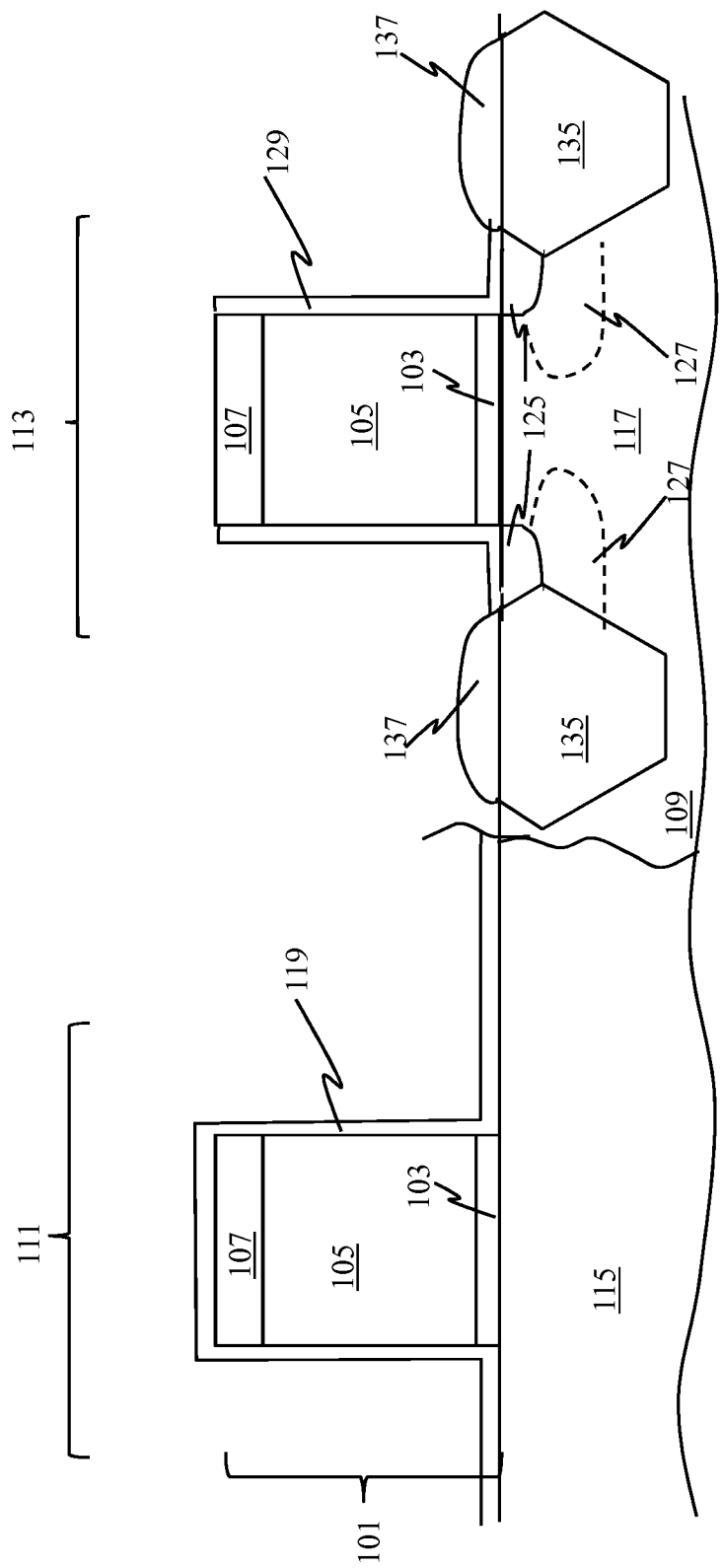
Figure 1F:
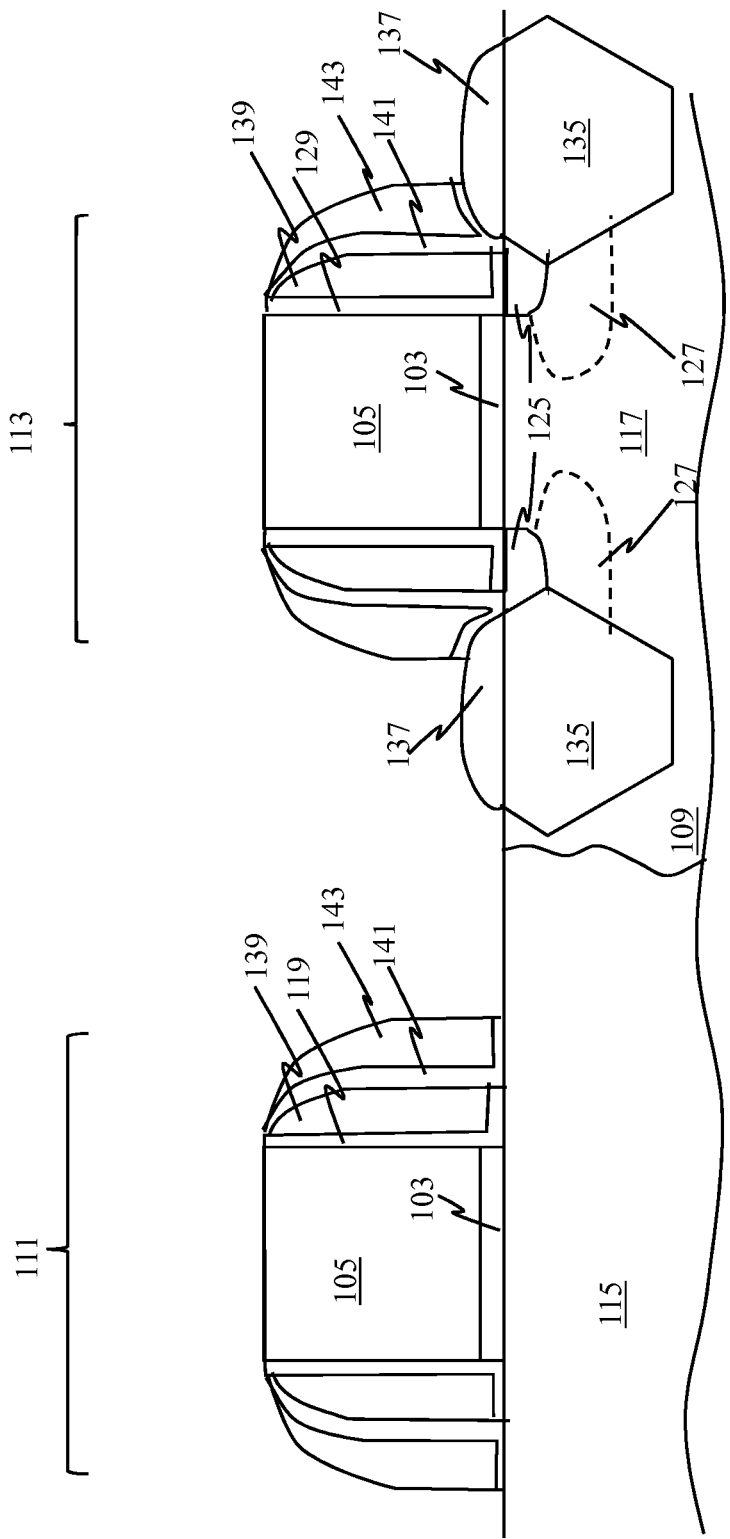

As illustrated in FIG. 1E, a cleaning step, e.g. with phosphoric acid ($H_3PO_4$), or a dry etch will remove SiN hardmask 121 from NMOS 111 and spacers 131 from PMOS 113. Adverting to FIG. 1F, SiN cap 107 is removed from each poly-Si 105. Next, a nitride layer is deposited on both PMOS 113 and NMOS 111, over oxide liners 119 and 129, and is etched to form nitride spacers 139 (spacer 1's). Another conformal liner 141 and a SiN layer are then sequentially deposited, and conformal spacers 143 (spacer 2's) are etched from the SiN layer on both PMOS 113 and NMOS 111. The conformal liner may, for example be formed of $SiO_2$ to a thickness of 15 nm to 22 nm. Spacers 143 are formed to a thickness of 15 nm to 22 nm. Conformal spacers 143 are required for source/drain implantations for the NMOS to form source/drain regions 145, and for a subsequent salicidation process.

Figure 1G:
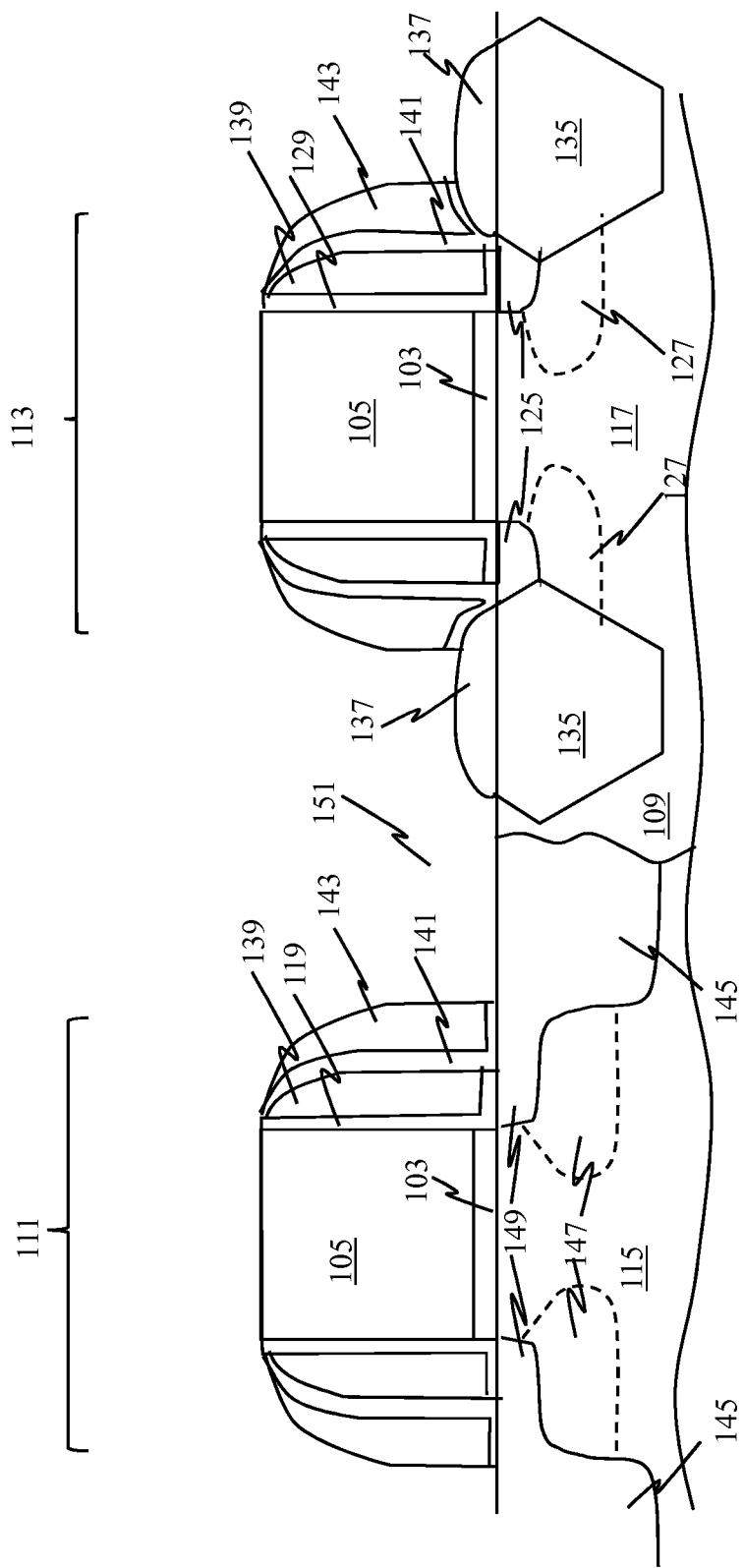

As illustrated in FIG. 1G, implantations for NMOS halo areas 147, LDD areas 149, and deep source/drain regions 145 are performed. Next, a rapid temperature annealing freezes and activates all of the implanted dopants and allows them to diffuse. For forming deep source/drain regions, As, B, or $BF_2$ may, for example, be implanted at a high dose (e.g., 2E15) and high energy (e.g., 6 keV for B or 20 keV for As). Low doped drain areas are formed by implanting a high dose (e.g. 1.1E15) of AS, B, or $BF_2$ at a low energy (for example 0.7 keV for B or 4 keV for As).

Figure 1H:
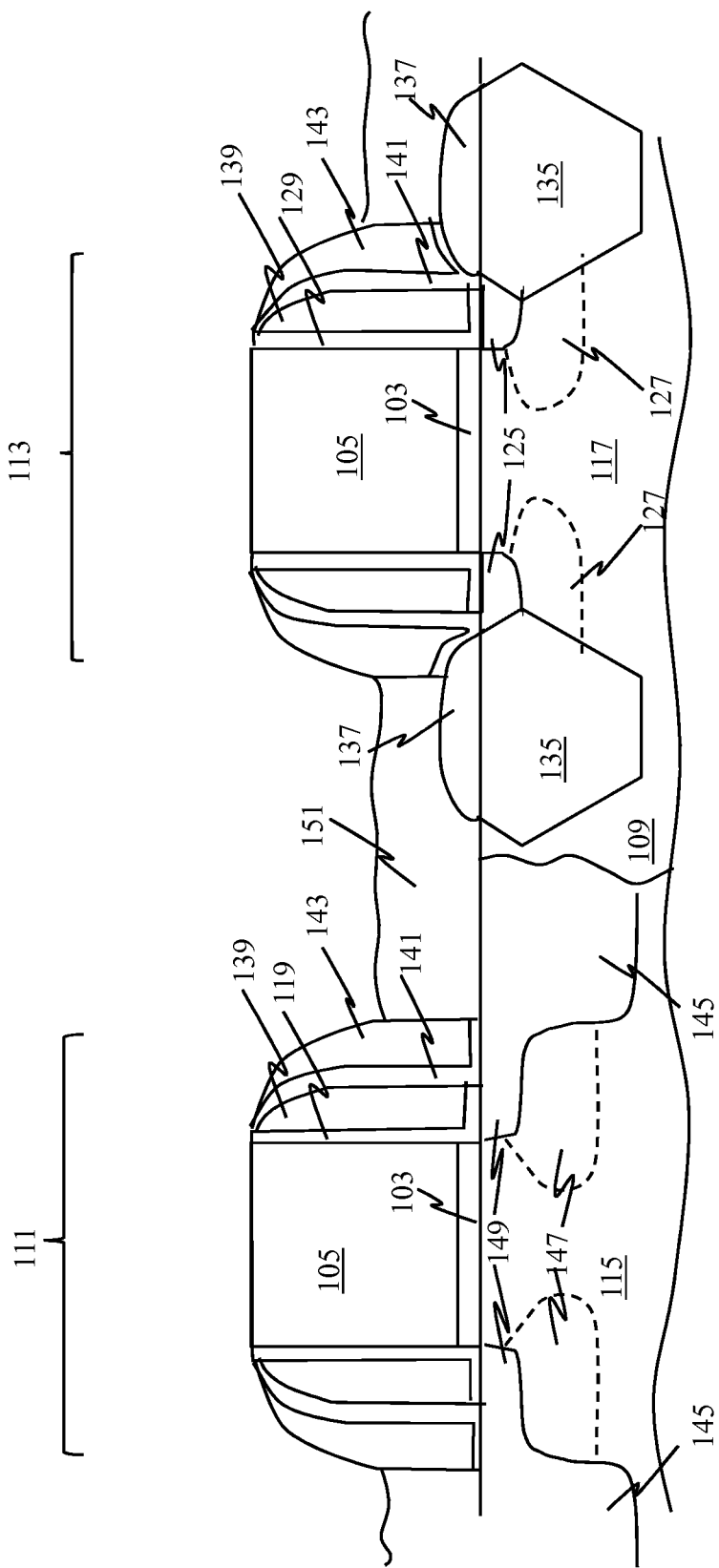

Adverting to FIG. 1H, a wet gap fill or optical protection layer (OPL) 151 is spun over the entire device and then reduced/recessed between the NMOS 111 and PMOS 113 to a thickness of 400 to 600 Å. To recess wet gap fill or OPL 151, a baking or ashing process is performed at 60 to 90° C. for 50 to 150 seconds. The remaining wet gap fill or OPL 151 protects the foot of the spacers 143 as well as the Si and SiGe source/drain regions.

Figure 1I:
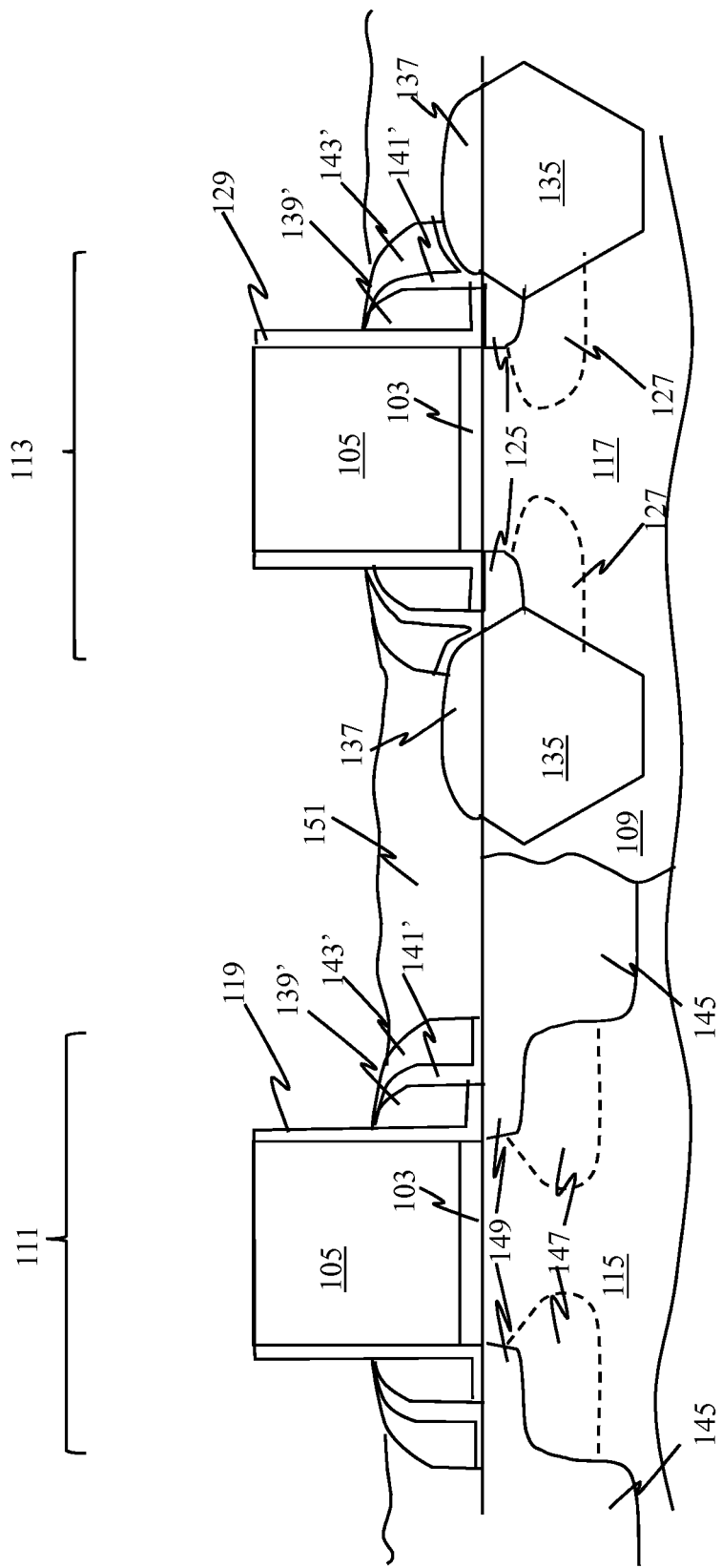

As illustrated in FIG. 1I, top portions of spacers 139 and 143 are dry etched down to wet gap fill or OPL 151, leaving spacers 139' and 143' and liner 141'. Poly-Si 105, halo areas 127 and 147, low doped drain areas 125 and 149, deep source/drain regions 145, and SiGe 135 are not attacked during the dry etch.

Figure 1J:
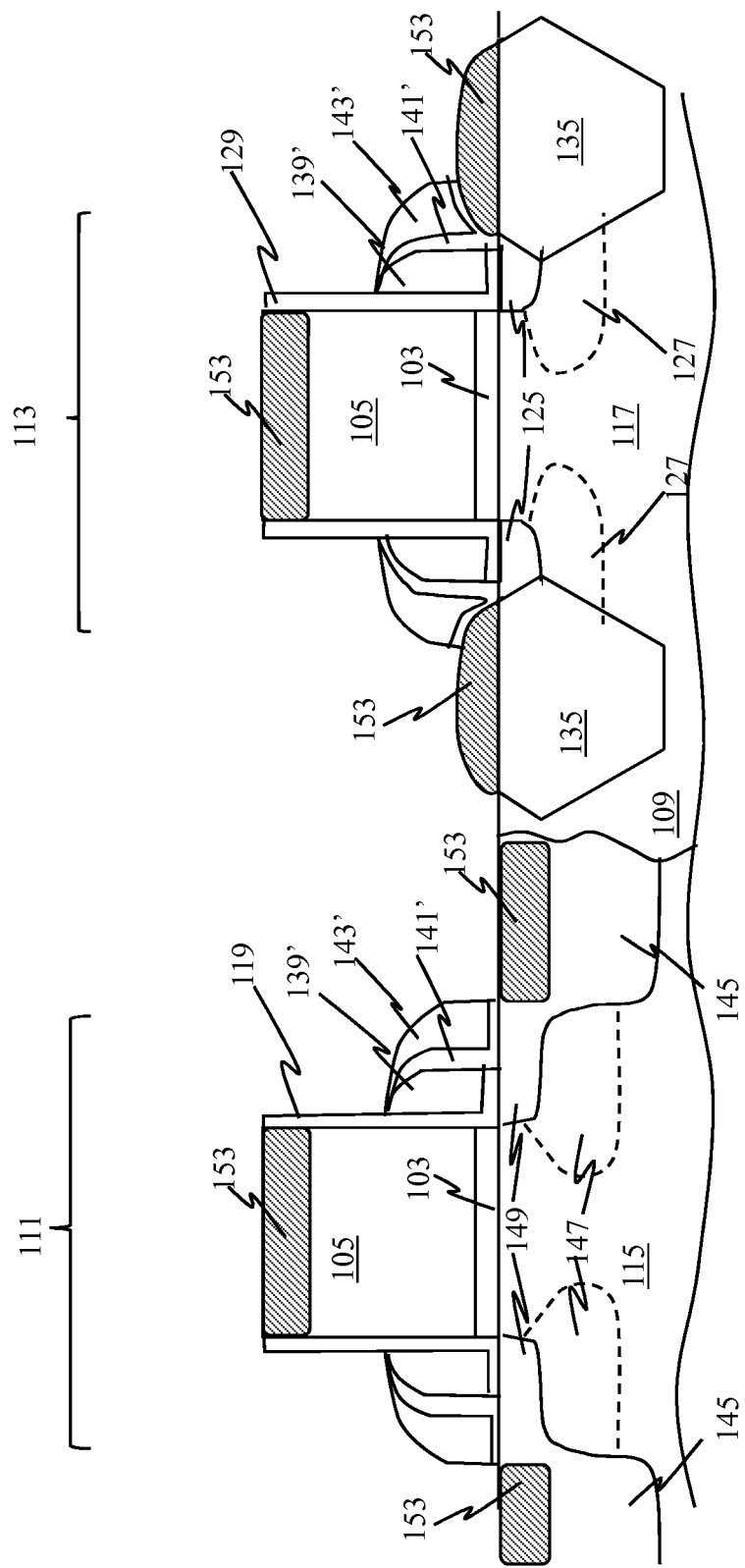

Next, as illustrated in FIG. 1J, wet gap fill or OPL 151 is removed by a plasma strip and clean process. Metal, for example nickel (Ni), nickel platinum (Ni/Pt), or titanium (NiTi), may then be deposited over the entire device and annealed to form a silicide 153 (i.e., NiSi, NiPtSi, or TiSi) over source/drain regions 145, silicon cap 137, and poly-Si 105 to form low resistance areas. The remaining spacers 139' and 143' protect LDD regions 125 and 149 as well as deep source/drain areas 145 from lateral silicide overrun. The silicide combined with the SiGe lowers the sheet and contact resistance, thereby improving performance behavior. The distance is set by the spacer width and needs to be optimized regarding the electrical performance of the device.

Figure 1K:
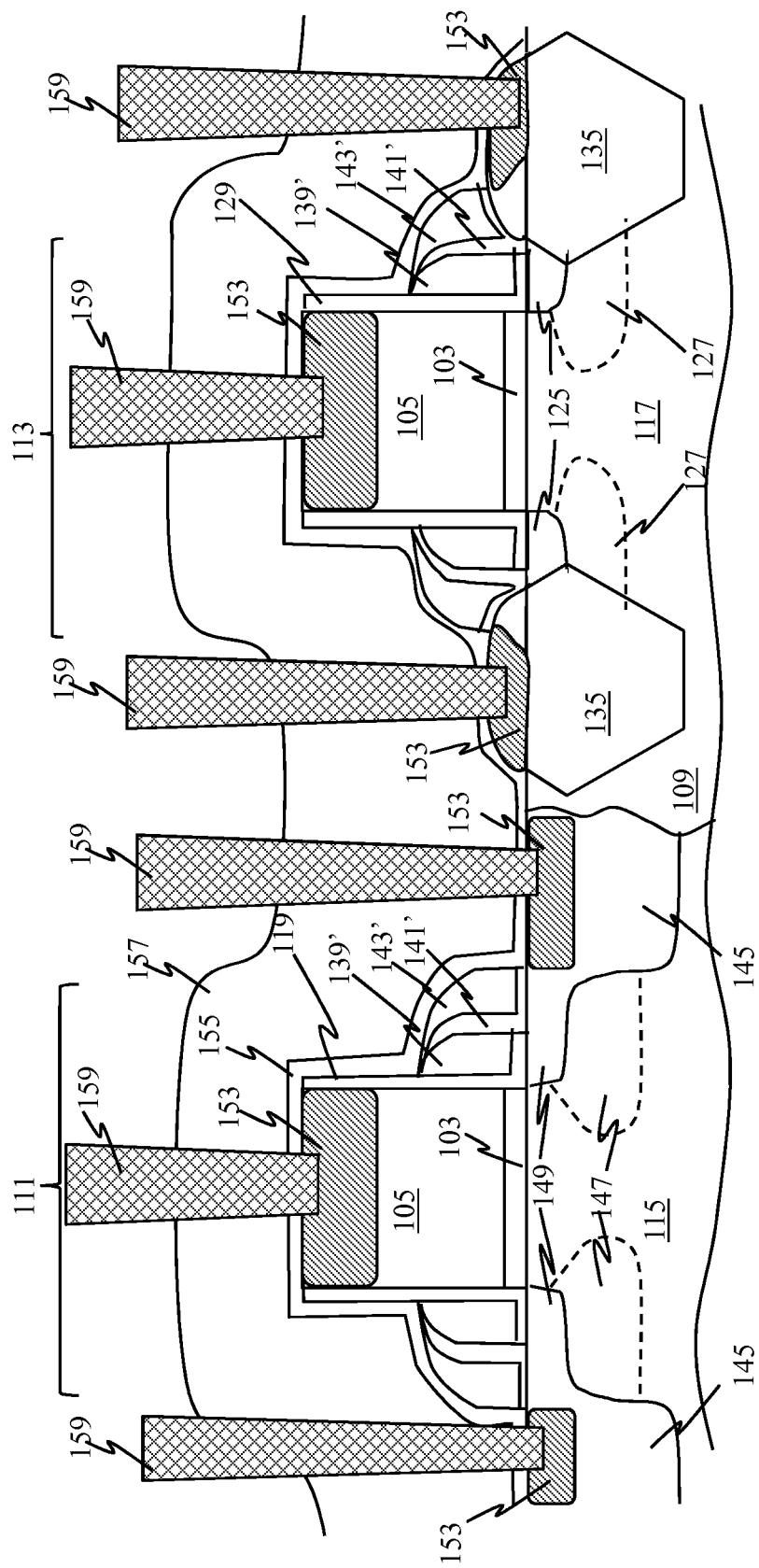

Adverting to FIG. 1K, after the silicidation, a contact isolation material 157, which is usually strained can be deposited over the entire substrate, without any prior spacer shaper etch, since enough space has been made by the spacer pull back process. There is no risk of voids that can cause contact shorts in the following contact module, in which source/drain and gate contacts 159 are formed through contact isolation material 157.

Figure 1L:
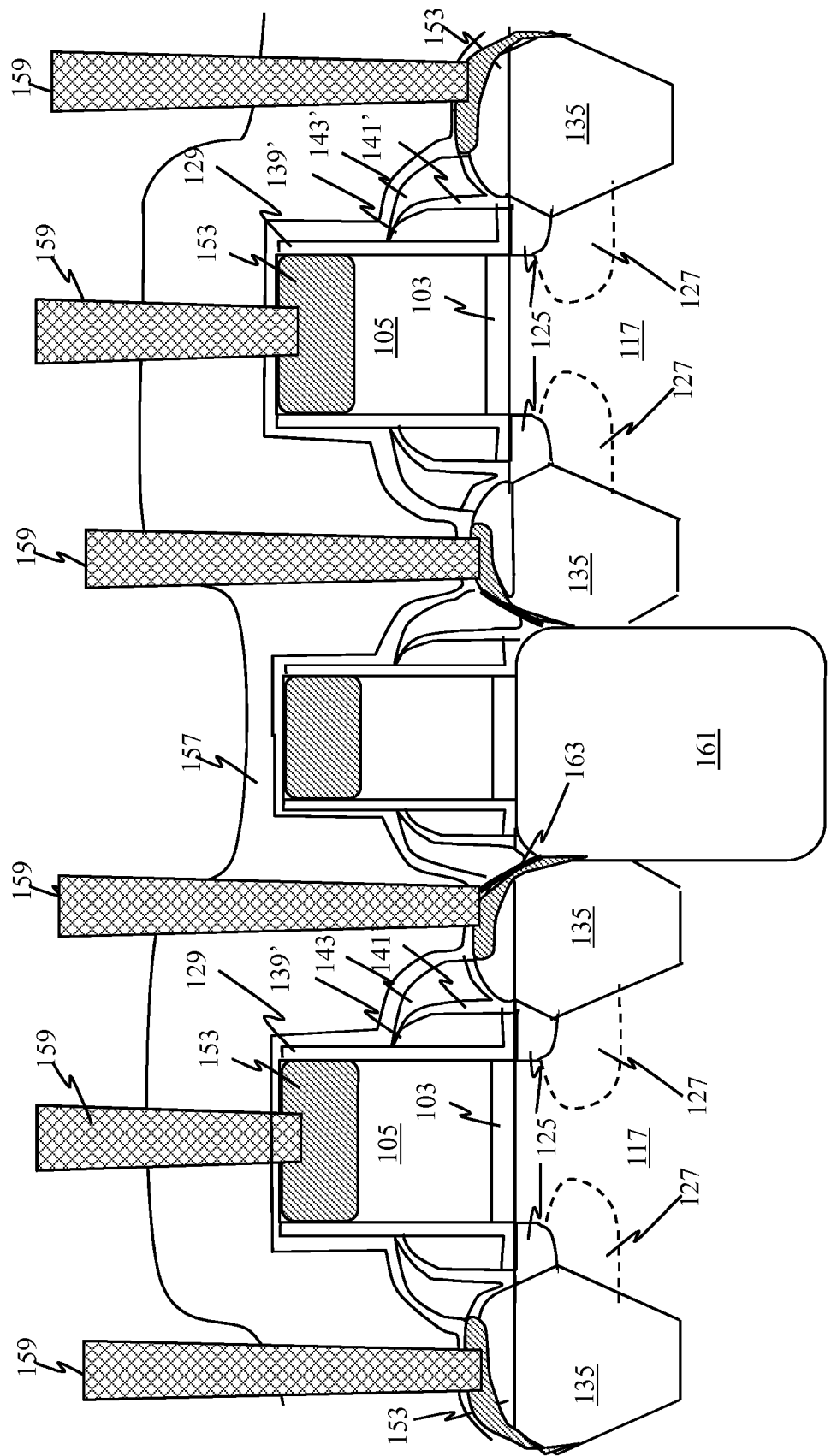
FIG. 1L schematically illustrates two PMOS devices at a shallow trench isolation (STI) boundary, in accordance with an exemplary embodiment.

As illustrated in FIG. 1L, two narrow PMOS devices may be formed on a STI region 161 boundary, with an additional gate stack formed on the STI region. The SiN spacers protect the SiGe areas, which have a ski slope shape (shown at 163) and which are normally attacked during the spacer shaper etch. Since the SiGe does not get removed, there is more strain in the STI boundary PMOS devices which results in performance improvement.

The embodiments of the present disclosure can achieve several technical effects, including eliminating a spacer shaper etch, thereby protecting source/drain silicide which is normally attacked by the spacer shaper etch, which in turn results in improved serial resistance, device performance, and yield. In addition, product and standard cell library performance is improved, more SiGe remains on the STI boundary, less silicon is lost for narrow width devices, electrical variation is reduced due to less silicon recess, and the stress liners are formed closer to the device channel area. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated low power and high performance semiconductor devices, particularly for 32 nm technologies and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming first and second polysilicon (poly-Si) gate stacks on an upper surface of a substrate;
   forming a hardmask over the second poly-Si gate stack;
   forming embedded silicon germanium (eSiGe) at opposite sides of the first poly-Si gate stack;
   forming a silicon cap over the eSiGe;
   removing the hardmask;
   forming nitride spacers at opposite sides of each of the first and second poly-Si gate stacks;
   forming deep source/drain regions at opposite sides of the second poly-Si gate stack;
   forming a wet gap fill layer around each of the first and second poly-Si gate stacks to a thickness less than a height of the poly-Si gate stack from the substrate's upper surface;
   removing an upper portion of the nitride spacers down to the height of the wet gap fill layer;

removing the wet gap fill layer after removing the upper portion of the nitride spacers; and performing silicidation of the deep source/drain regions and the silicon cap over the eSiGe after removing the wet gap fill layer.

2. The method according to claim 1, comprising forming the hardmask over the second poly-Si gate stack by:
   forming a hardmask over the first and second poly-Si gate stacks and over the substrate;
   forming a resist over the second poly-Si gate stack and a portion of the substrate adjacent each side of the second poly-Si gate stack;
   anisotropically etching the hardmask over the first poly-Si gate stack and a portion of the substrate adjacent each side of the first poly-Si gate stack, leaving spacers at opposite sides of the first poly-Si gate stack; and
   removing the resist.

3. The method according to claim 2, comprising forming the eSiGe at opposite sides of the first poly-Si gate stack in the portion of the substrate adjacent each side of the first poly-Si gate stack.

4. The method according to claim 3, comprising forming the eSiGe at opposite sides of the first poly-Si gate stack by:
   forming a cavity by wet etching with tetramethylammonium hydroxide (TMAH); and
   epitaxially growing SiGe in the cavity.

5. The method according to claim 4, further comprising implanting a boron dopant in-situ into the eSiGe.

6. The method according to claim 5, comprising implanting boron with a graded doping profile.

7. The method according to claim 1, further comprising forming a lightly doped drain region and a halo region at opposite sides of the first poly-Si gate stack after forming the hardmask.

8. The method according to claim 1, wherein:
   forming nitride spacers at opposite sides of each of the first and second poly-Si gate stacks comprises forming two spacers at each side of each of the first and second poly-Si gate stacks.

9. The method according to claim 8, further comprising forming halo regions and extension regions at opposite sides of the second poly-Si gate stack after forming the nitride spacers.

10. The method according to claim 9, further comprising performing a rapid temperature anneal after forming the deep source/drain regions, the halo regions, and the extension regions.

11. The method according to claim 1, comprising forming the wet gap fill layer by:
    spinning a wet gap fill material over the first and second poly-Si gate stacks and over the substrate; and
    removing the wet gap fill material down to a thickness of 400 to 600 Å from a top surface of the substrate.

12. The method according to claim 11, comprising removing the wet gap fill material by baking or ashing at 60 to 90° C. for 50 to 150 seconds.

13. The method according to claim 1, comprising removing the upper portion of the nitride spacers by dry etching.

14. The method according to claim 1, comprising removing the wet gap fill layer by a plasma strip and clean process.

15. A device comprising:
    first and second polysilicon (poly-Si) gate stacks on an upper surface of a substrate;
    nitride spacers at opposite sides of each of the first and second poly-Si gate stacks, the nitride spacers having a height less than a height of the poly-Si gate stacks from the substrate's upper surface;
    embedded silicon germanium (eSiGe) at opposite sides of the first poly-Si gate stack;
    a silicon cap over the eSiGe;
    deep source/drain regions at opposite sides of the second poly-Si gate stack;
    extension and halo regions at opposite sides of the first poly-Si gate stack; and
    a silicide over the deep source/drain regions and the silicon cap over the eSiGe.

16. The device according to claim 15, wherein the eSiGe is doped in-situ with boron having a graded doping profile.

17. The device according to claim 15, further comprising:
    halo and extension regions at opposite sides of the second poly-Si gate stack.

18. The device according to claim 15, further comprising a void-free strained contact isolation material over and between the first and second poly-Si gate stacks.

19. The device according to claim 18, wherein the strained contact isolation material comprises plasma enhanced nitride.

20. A method comprising:
    forming first and second polysilicon (poly-Si) gate stacks on an upper surface of a substrate;
    forming a hardmask over the first and second poly-Si gate stacks and over the substrate;
    anisotropically etching the hardmask over the first poly-Si gate stack and a portion of the substrate adjacent each side of the first poly-Si gate stack, leaving spacers at opposite sides of the first poly-Si gate stack;
    forming a cavity at each side of the PMOS poly-Si gate stack by wet etching with TMAH;
    epitaxially growing SiGe in the cavity;
    implanting a boron dopant, with a graded doping profile, in-situ into the eSiGe concurrently with the epitaxial growth;
    forming a silicon cap over the eSiGe;
    removing the hardmask and the spacers;
    forming nitride spacers at opposite sides of each of the first and second poly-Si gate stacks;
    forming deep source/drain regions at opposite sides of the second poly-Si gate stack;
    spinning a wet gap fill material over the first and second poly-Si gate stacks and over the substrate;
    baking or ashing the wet gap fill material, reducing a thickness of the wet gap fill material to 400 to 600 Å from a top surface of the substrate;
    removing an upper portion of the nitride spacers down to the wet gap fill layer;
    removing the wet gap fill layer after removing the upper portion of the nitride spacers;
    performing silicidation of the deep source/drain regions and the silicon cap over the eSiGe after removing the wet gap fill layer; and
    forming a void-free strained contact isolation material over and between the first and second poly-Si gate stacks.

* * * * *